United States Patent [19]
Seyyedy

[11] Patent Number: 5,636,170
[45] Date of Patent: Jun. 3, 1997

[54] LOW VOLTAGE DYNAMIC MEMORY

[75] Inventor: Mirmajid Seyyedy, Boise, Id.

[73] Assignee: Micron Technology, Inc., Boise, Id.

[21] Appl. No.: 559,183

[22] Filed: Nov. 13, 1995

[51] Int. Cl.$^6$ .................................................. G11C 7/00
[52] U.S. Cl. .......................... 365/205; 365/149; 365/207
[58] Field of Search .................................. 365/205, 207, 365/149, 206

[56] References Cited

U.S. PATENT DOCUMENTS 5,414,662  5/1995  Foss et al. ........................... 365/149 X
5,444,662  8/1995  Tanaka et al. ....................... 365/205 X

OTHER PUBLICATIONS

T. Inaba, et al., "A 250mV Bit–Line Swing Scheme for a 1V 4Gb DRAM", 1995 *Symposium on VLSI Circuits Digest of Technical Papers*, Toshiba Corporation, (2 pgs.).

Primary Examiner—David C. Nelms
Assistant Examiner—Huan Hoang
Attorney, Agent, or Firm—Schwegman, Lundberg, Woessner & Kluth, P.A.

[57] ABSTRACT

A low voltage high density memory device is described. The memory device uses isolation transistors to adjust the voltage stored on memory cells. The memory device is designed to reduce the differential voltage between memory cells storing different data states. A method is described for reducing leakage current of the memory cells to decrease the need for excessive refresh operations. The memory device is described as operating on a one volt supply and producing a 250 mv digit line swing.

18 Claims, 5 Drawing Sheets

LOW VOLTAGE DYNAMIC MEMORY

TECHNICAL FIELD OF THE INVENTION

The present invention relates generally to memory circuits and in particular the present invention relates to memory circuits with low supply voltages.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is typically comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted internally on signal lines, referred to as bit or digit lines, which are coupled to input/output lines through transistors used as switching devices.

Although unique fabrication techniques and processes have been developed to reduce the size of the memory cells and access circuitry, reliability and power consumption remain concerns in the move for giga-bit memory devices. The solution to these concerns appears to be lower operating voltages. However, lower operating voltages create additional problems. One such problem is the need for increased memory refresh operations due to leakage currents.

For the reasons stated above, and for other reasons stated below which will become apparent to those skilled in the art upon reading and understanding the present specification, there is a need in the art for a high density, low voltage memory device having minimum memory cell leakage.

SUMMARY OF THE INVENTION

The above mentioned problems with low voltage memory devices and other problems are addressed by the present invention and which will be understood by reading and studying the following specification. A memory device is described which can operate on a one volt supply and provide a 250 mv swing on a digit line.

In particular, the present invention describes an integrated memory circuit comprising memory cell capacitors, access devices connected between the memory cell capacitors and a communication line, a sense amplifier circuit, and an n-type isolation transistor and a p-type isolation transistor electrically located between the sense amplifier circuit and the communication line. The access devices can comprise an n-type access transistor having a source connected to one plate of the memory cell capacitors, and a drain connected to the communication line. In one embodiment the n-type access transistor is fabricated in a p-well electrically biased to a non-zero voltage level.

In another embodiment, a method of storing data in an integrated memory device is described. The method comprises the steps of storing a reduced voltage on a first memory capacitor, where the reduced voltage is a threshold voltage level below a supply voltage, and storing an increased voltage on a second memory capacitor, where the increased voltage is a threshold voltage level above a lower reference voltage. The method can further include the step of adjusting a substrate bias voltage to minimize leakage currents.

In yet another embodiment, a method of storing data in a memory device is described. The method comprises the steps of providing a supply voltage to a source and gate of an n-channel transistor, the supply voltage being approximately one volt, coupling a drain of the n-channel transistor to a first memory cell, connecting a drain and gate of a p-channel transistor to ground, and coupling a source of the p-channel transistor to a second memory cell.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Dual Digit Line Memory Device

Figure 1:
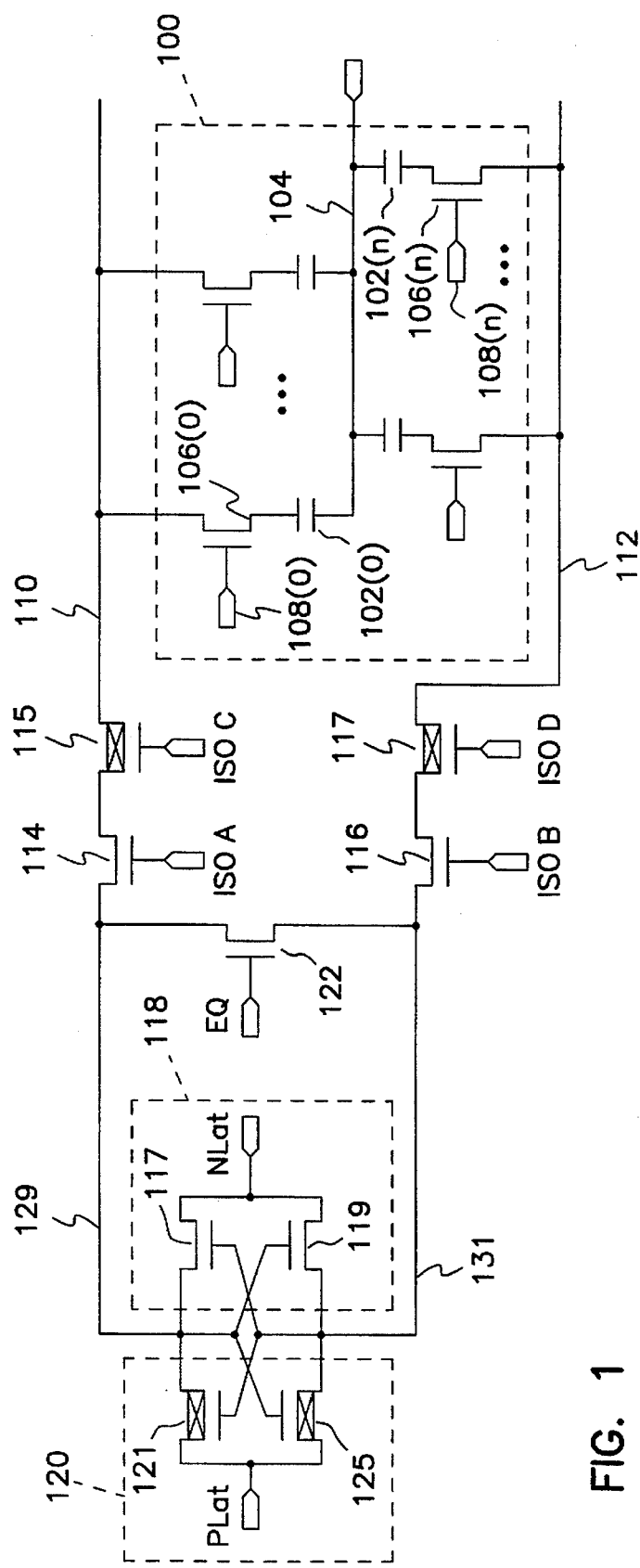
FIG. 1 is a portion of a memory device of the present invention.

Referring to FIG. 1, a portion of memory device of the present invention and incorporating a dual, or folded, digit line is described. A memory array 100 has a plurality of memory cells 102(0)–(n) which are fabricated as capacitors having one capacitive plate formed as a common cell plate 104 and the other plate connected to an access transistor 106(0)–(n). Each access transistor is a n-type transistor having its gate connected to a word line 108(0)–(n). The cell plate 104 is typically biased to one-half the power supply voltage (Vcc) by a biasing source (not shown).

Digit lines 110 and 112 are each connected to some of the access transistors for selective coupling to memory cells. When access transistors 106 are selectively activated, the charge stored on the corresponding memory cell 102 is coupled to one of the digit lines. N-type isolation transistors 114 and 116, and p-type isolation transistors 115 and 117 are used to isolate digit lines 110 and 112, respectively, from both the n-sense amp 118 and the p-sense amp 120. Equilibrate transistor 122 is used to equalize the nodes of the sense amps to the same voltage, as described below.

Figure 2:
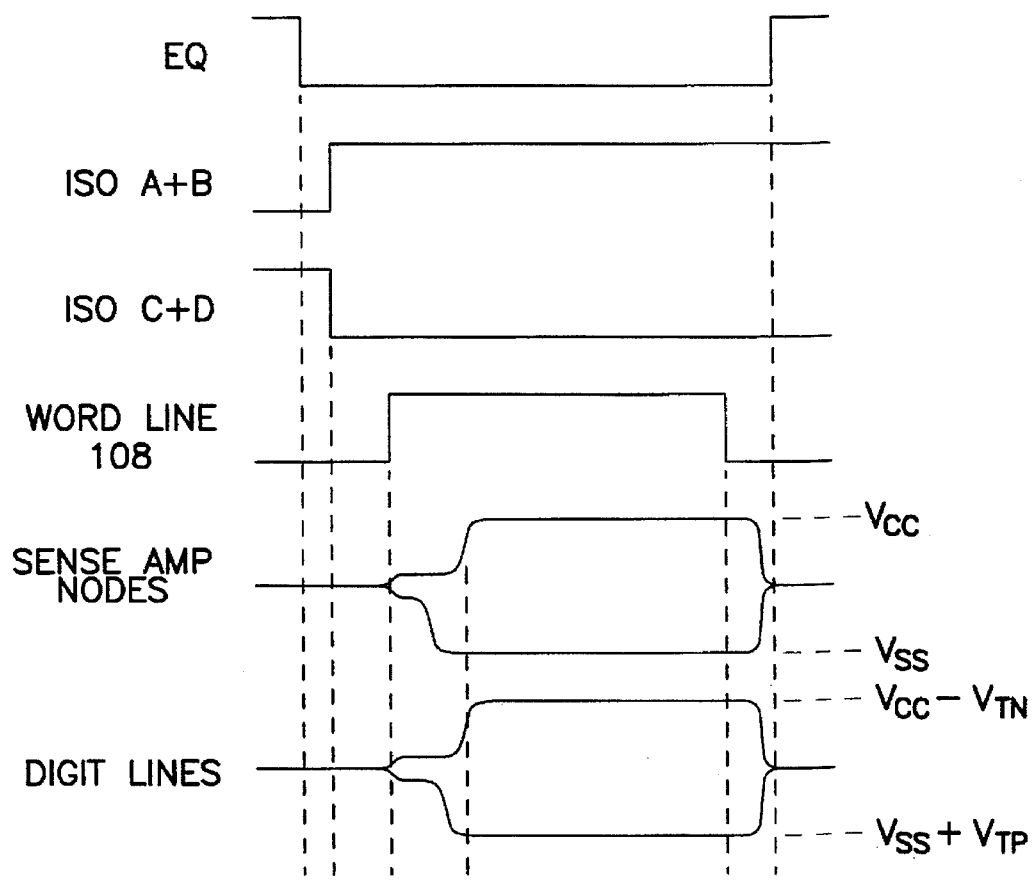
FIG. 2 is a timing diagram of FIG. 1.

In operation, data stored in the memory cells can be accessed and sensed following the process shown in FIG. 2. The first step is to equilibrate nodes 129 and 131 of sense amps 118 and 120 to Vcc/2, as sourced by a biasing circuit (not shown), by holding the gate of equilibrate transistor 122 (EQ) high. The differential voltage across the sense amps is therefore zero with each node having a preferred voltage of one-half the supply voltage (Vcc). The next step is to activate isolation transistors 114–17 by providing their gates (ISO A–D, respectively) with an appropriate voltage. This connects the digit lines 110 and 112 to the sense amps 118 and 120 and allows the digit lines to also stabilize to Vcc/2. It will be understood that the isolation transistors and the equilibrate transistor can be activated in different sequences without departing from the present invention. One of the memory cell access transistors 106(0) is then selectively activated by raising the associated word line 108(0) gate voltage. The charge, or lack of charge, stored on the selected memory cell 102 is then shared with one of the digit lines. If a logical "one" is stored on the capacitor the associated digit line will be slightly raised, for example by a voltage of approximately 125 mv. It will be understood that the charge shared with the digit line is directly dependant upon the charge stored on the memory cell. If the memory cell is storing a logic zero, the digit line voltage will drop, for example by 125 mv.

The n-sense amp 118 and the p-sense amp 120, as known to one skilled in the art, sense a differential between the digit lines and drive the sense amplifier nodes 129 and 131 to full rails in response. Digit lines 110 and 112 will be driven to either $Vcc-V_{TN}$ or $Vss+V_{TP}$. N-sense amp 118 has two n-channel transistors having their gates cross-coupled to the source of the other transistor. The drains of each transistor are connected together and controlled by an NLat line. The NLat line is typically pre-charged to the same level that nodes 129 and 131 have been equalized to, Vcc/2. The voltage on the NLat line is lowered to sense a high voltage on one of the nodes. Assuming for example that node 129 is 125 mv above node 131, transistor 119 will begin to turn on when the NLat drops by a threshold voltage below node 129. Node 131 will then be pulled to NLat to insure that transistor 117 does not turn on. Similarly, p-sense amp 120 has two cross-coupled p-channel transistors 121 and 125. The drains of each transistor are connected together and controlled by a PLat line. The PLat line is typically pre-charged to the same level that nodes 129 and 131 have been equalized to, Vcc/2. The voltage on the PLat line is raised to sense a low voltage on one of the nodes. Assuming for example that node 131 is 125 mv below node 129, transistor 121 will begin to turn on when the PLat increases by a threshold voltage above node 131. Node 129 will then be pulled to PLat to insure that transistor 125 does not turn on. The NLat and PLat are strobed to full power rails, ground and Vcc, respectively. If one of the digit lines is higher, therefore, that digit line will be driven to $Vcc-V_{TN}$ while the complementary digit line is pulled to $Vss+V_{TP}$.

Isolation transistors 114–117 are used to adjust the voltage stored on the memory cells. That is, N-type isolation transistors 114 and 116 will only allow digit lines 110 and 112, respectively, to reach a maximum level of $VCC-V_{TN}$, where $V_{TN}$ is the threshold voltage of the n-type transistor. ISO A and B, therefore, are raised to Vcc and not "pumped" to a voltage above Vcc. In the present invention, Vcc is approximately 1 volt and the $V_{TN}$ is 0.375 volt. As a result, the maximum voltage stored on a memory cell will not reach Vcc.

Likewise, p-type isolation transistors 115 and 117 are used to raise the minimum voltage stored on the memory cells. The p-type isolation transistors will pull digit lines 110 and 112 to a voltage level equal to $Vss+V_{TP}$, where $V_{TP}$ is the threshold voltage of the p-type transistors. In the present invention, Vss is approximately 0 volts and the $V_{TP}$ is 0.375 volt. As a result, the minimum voltage stored on a memory cell will be approximately 0.375 volts.

It will be appreciated by those skilled in the art that by reducing the voltage differential between adjacent memory cells, increased memory cell population can be achieved without breakdowns in isolation oxide between the cells due to larger differential voltages. Because there are fewer sense amplifiers than memory cells, the spacing requirements for the sense amplifiers 118 and 120 are not as critical as that of the memory cells. The sense amplifiers, therefore, can be spaced farther apart and operated at higher voltages.

Figure 3:
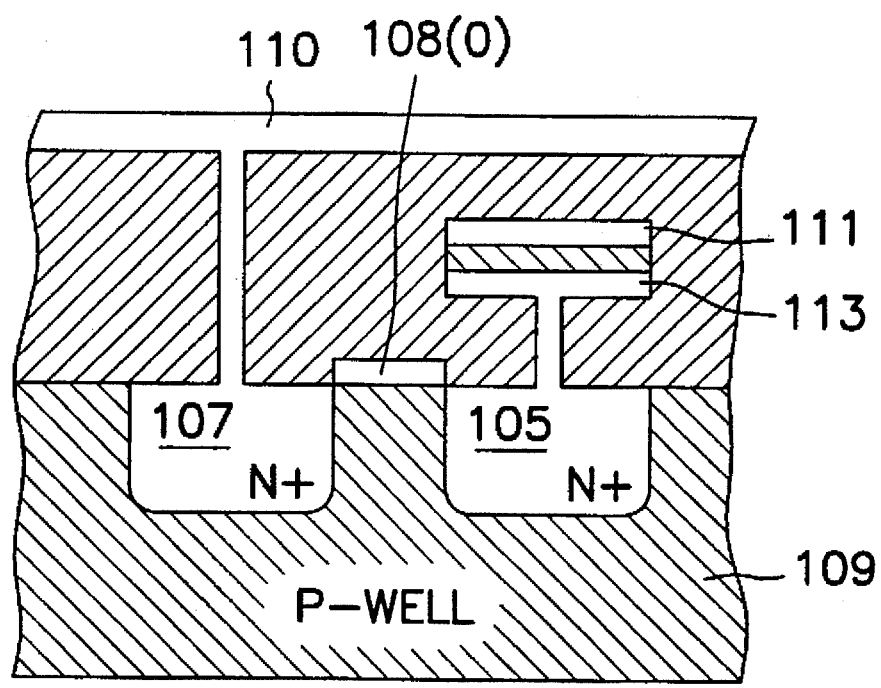
FIG. 3 is cross section of a memory cell of FIG. 1.

The reduced memory cell voltages highlight the need for reduced leakage current on the memory cells. FIG. 3 illustrates a cross section of a memory circuit of FIG. 1. Digit line 110 is connected to the drain 107 of transistor 106(0). Memory cell 102(0) is fabricated as common plate 111 and the storage plate 113. The storage plate is connected to the source 105 of transistor 106(0). There are two primary types of leakage current which decrease the performance of a memory cell: junction leakage and sub-threshold leakage. Junction leakage is a leakage current between the source 105 and the p-well or substrate 109. The sub-threshold leakage is a current between the source 105 and the drain 107 when transistor 106(0) is turned off. Both leakage currents are susceptible to process variables and substrate bias. If the p-well bias is raised to a level above Vss, the junction leakage current is reduced while the sub-threshold leakage current is increased. Conversely, if the bias level is reduced below Vss, the sub-threshold leakage current is decreased while the junction leakage current is increased. As a result, the p-well bias can be adjusted based upon the leakage characteristics of processed memory devices. For example, if the sub-threshold leakage of a memory device is low and the junction leakage is high, the p-well bias can be raised to reduce the junction leakage. Similarly, the p-well bias can be reduced to reduce the sub-threshold leakage if the junction leakage is low and the sub-threshold leakage is high.

The combination of reducing the voltage differential between memory cells storing different logic states and reducing leakage currents using the substrate bias allows memory devices to be manufactured with very dense memory cells. With the differential voltage reduced, memory cells can be spaced closer than currently possible without experiencing breakdown in the isolation oxide. The data stored on the memory cells can be maintained for increased periods of time by minimizing the leakage current of the memory cells through adjustments to the substrate bias level. The design and fabrication techniques of the above described low voltage memory device are not limited to DRAMs or memories having dual digit lines. The present invention can be included in any dynamic memory device, including those having a single digit lines.

Single Digit Line Memory Device

Figure 4:
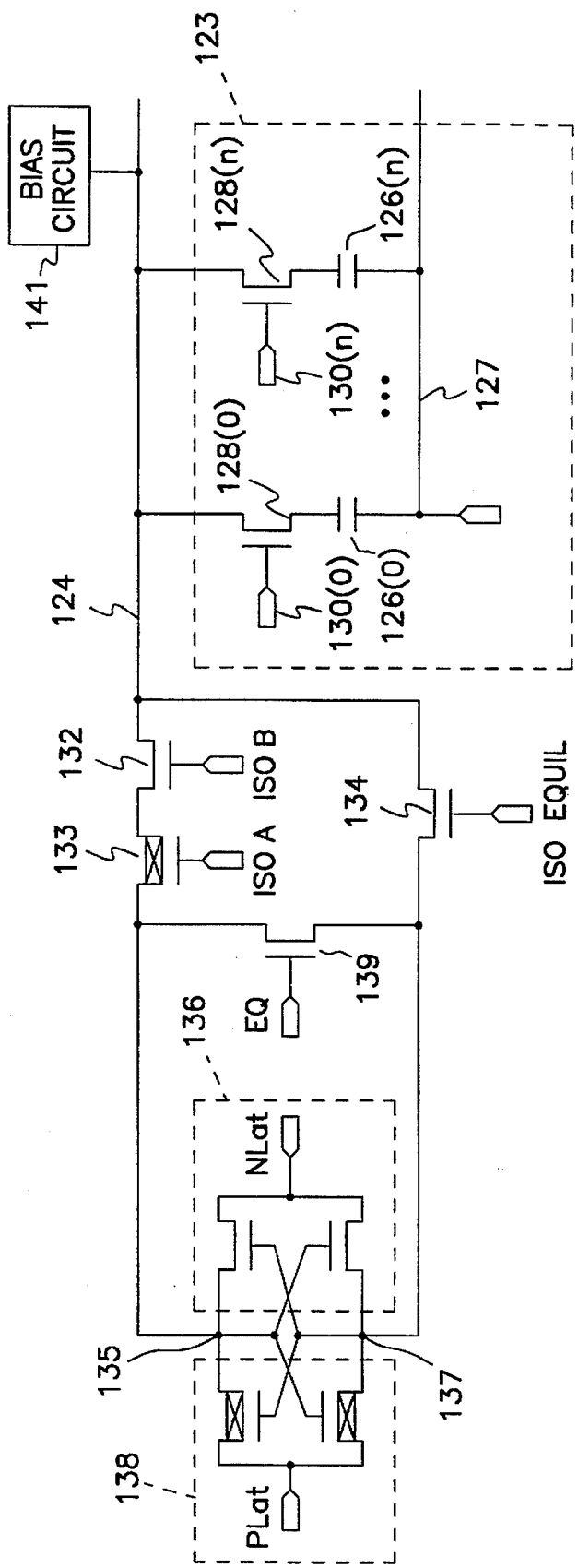
FIG. 4 is a portion of an alternate memory device of the present invention.

Digit lines are typically fabricated as metal lines which require a relatively large commitment of die area and create a barrier to increasing the density of a memory device. It is beneficial, therefore, to reduce the number of digit lines. FIG. 4 illustrates a sensing circuit of the present invention using a single digit line structure. A memory array 123 is comprised of memory cells 126(0)–(n) fabricated as capacitors with one node connected to a common cell plate 127. The cell plate is biased to one-half Vcc by a biasing circuit (not shown). The other plate of each memory cell 126 is connected to one of the n-type access transistors 128(0)–(n). The access transistors are connected to digit line 124 and have their gate connected to one of the word lines 130(0)–(n). Isolation transistors 132 and 133 are provided to selectively isolate digit line 124 from node 135 of both the n-sense amplifier 136 and the p-sense amplifier 138. Likewise, n-type isolation/equilibrate transistor 134 is connected between node 137 of the sense amplifiers and the digit line 124. N-type equilibrate transistor 139 is provided to equalize nodes 135 and 137 of the sense amplifiers to a common voltage. As described below, this common voltage is preferably near Vcc/2.

Isolation transistors 132 and 133 are used to adjust the voltage stored on the memory cells. That is, N-type isolation transistor 132 will only allow digit line 124 to reach a maximum level of Vcc–$V_{TN}$, where $V_{TN}$ is the threshold voltage of the n-type transistor. ISO B, therefore, is raised to Vcc and not "pumped" to a voltage above Vcc. In the present invention, Vcc is approximately 1 volt and the $V_{TN}$ is 0.375 volt. As a result, the maximum voltage stored on a memory cell will not reach Vcc.

Likewise, p-type isolation transistor 133 is used to raise the minimum voltage stored on the memory cells. The p-type isolation transistors will pull digit line 124 to a voltage level equal to Vss+$V_{TP}$, where $V_{TP}$ is the threshold voltage of the p-type transistor. In the present invention, Vss is approximately 0 volts and the $V_{TP}$ is 0.375 volt. As a result, the minimum voltage stored on a memory cell will be approximately 0.375 volts.

As explained above, the reduced voltage differential between memory cells allows increases in memory cell population without breakdowns in isolation oxide between the cells. The spacing requirements for the sense amplifiers 136 and 138, however, is not as critical as that of the memory cells and can be operated at higher voltages.

Memory cells 130 are fabricated similar to that described above with reference to FIG. 3. Both junction and sub-threshold leakage currents effect the memory device of FIG. 4 and are susceptible to process variables and substrate bias. As with the dual digit line architecture, if the p-well bias is raised to a level above Vss, the junction leakage current is reduced while the sub-threshold leakage current is increased. If the bias level is reduced below Vss, the sub-threshold leakage current is decreased while the junction leakage current is increased. As a result, the p-well bias can be adjusted based upon the leakage characteristics of processed memory devices. For example, if the sub-threshold leakage of a memory device is low and the junction leakage is high, the p-well bias can be raised to reduce the junction leakage. Similarly, the p-well bias can be reduced to reduce the sub-threshold leakage if the junction leakage is low and the sub-threshold leakage is high.

Figure 5:
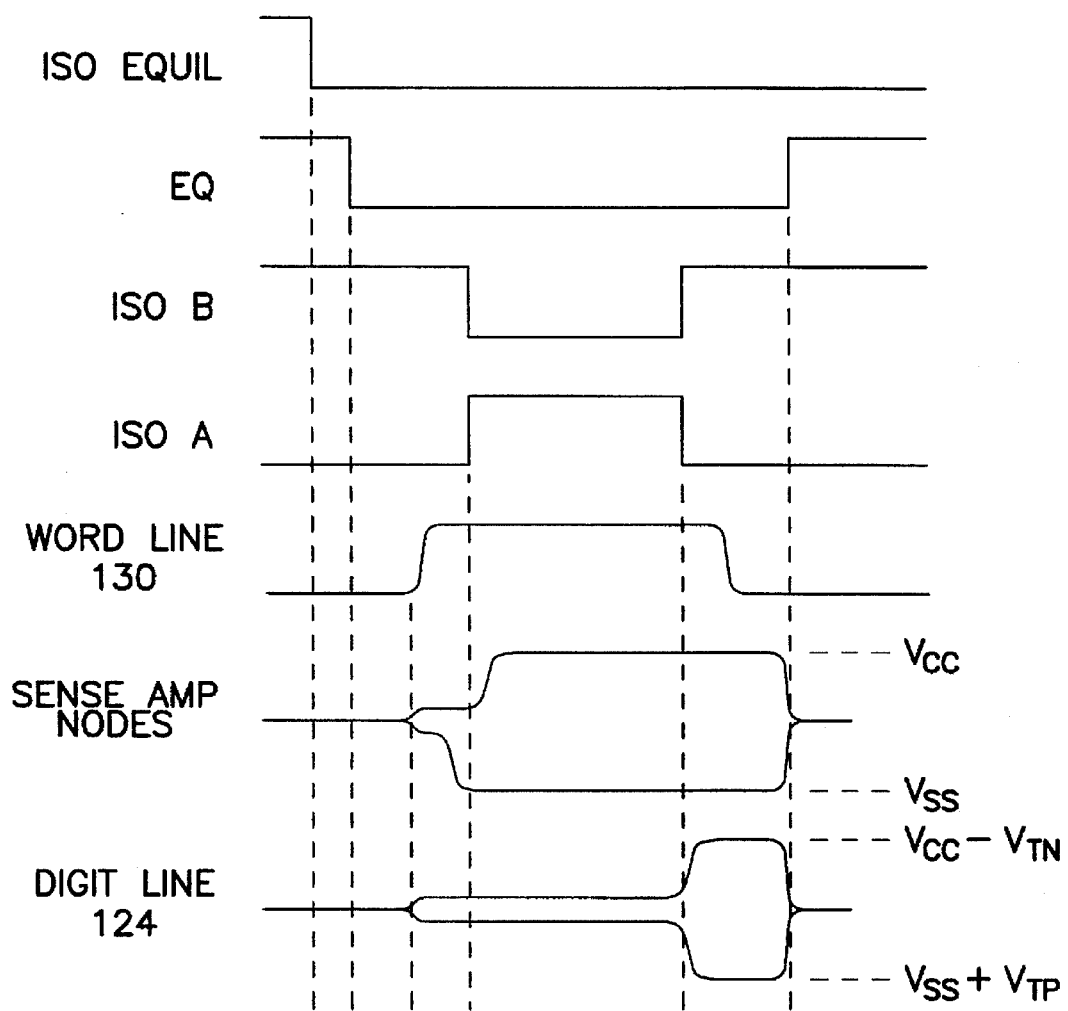
FIG. 5 is a timing diagram of FIG. 4.

Referring to FIG. 5, to sense data stored on a memory cell 126 the digit line 124 and nodes 135 and 137 of the sense amplifiers are equalized by activating the gate of transistor 139 (EQ). Transistor 134 is then turned off by lowering its gate voltage (ISO Equil). Prior to sensing stored data, the equilibrate transistor 139 is turned off to latch node 137 to the equilibrate voltage. One of the access transistors 128(0) –(n) is selectively activated by raising the corresponding word line 130(0)–(n). The charge stored in the memory cell is shared with the digit line and sense amplifier node 135. The change in the voltage on the digit line is dependent upon the charge stored in the memory cell, typically this voltage differential, as stated above, is approximately ±125 mv.

After the charge has been coupled to the digit line, isolation transistors 132 and 133 are turned off to isolate node 135 from the selected digit line. By isolating node 135 from the digit line 124, the capacitance of digit line 124 is eliminated. The sense amplifiers are then strobed using NLat and PLat to drive node 135 to the appropriate supply level, as known to one skilled in the art. That is, if node 135 is above the equilibrate level, the node is driven to Vcc and if node 135 is below the equilibrate level it is driven to ground. Isolation transistors 132 and 133 are then re-activated so that the entire digit line 124 can go to the appropriate power level and the memory cell can be refreshed. After word line 130 returns to a low level, the equilibrate transistor can be re-activated to insure that both nodes of the sense amplifiers and the digit line are equalized.

Connecting nodes 135 and 137 through transistor 139 while the sense amplifiers are activated will result in a crossing current in the sense amps. This crossing current can be relatively large and economically undesirable. It will be understood that when one sense amplifier node is originally at Vcc and the other is at ground, the resulting equilibrate level will be near Vcc/2.

Alternatively, transistor 134 can be used to selectively connect node 137 to the digit line 124 to equilibrate the sense amplifiers by forcing node 137 to an opposite state. That is, by first isolating node 135 from the digit line 124 and then activating transistor 134, the sense amplifiers will force the voltage on the digit line to change its state. If, for example, the digit line is a "one" when transistor 134 is activated, the voltage on the digit line will be forced to transition low by the n-sense amp. It will be understood that by holding node 135 constant and using transistor 134, crossing currents are avoided. A trigger or tracking circuit (not shown) can be used to latch the voltage at a level near Vcc/2. One embodiment would be to use a timing circuit to turn on equilibrate transistor 139 and turn off sense amplifiers 136 and 138.

CONCLUSION

A memory device has been described which operates at low supply voltages and therefore can be fabricated with high memory cell density. The memory device can be designed using a dual digit line architecture, or using a single digit line architecture. The memory device has both an N-type isolation transistor located between sense amplifiers and memory cells, and a P-type isolation transistor located between the sense amplifiers and the memory cells. The two isolation transistors are used to "clamp" both the low and high voltages stored on the memory cells. The reduced differential voltage between adjacent memory cells reduces the stress on isolation oxide between the cells. By adjusting the bias voltage of the substrate, leakage currents can be reduced in the memory cells such that the low voltage levels do not require excessive refresh operations. The memory can be operated on a one volt power supply while producing a 250 mv swing on the digit line.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, different equilibration circuits can be used in the single digit line circuit. Therefore, it is manifestly intended that this invention be limited only by the claims and the equivalents thereof.

What is claimed is:

1. An integrated memory circuit comprising:
   a plurality of memory cell capacitors;
   a plurality of access devices connected between the plurality of memory cell capacitors and a communication line, each for selectively connecting one of the plurality of memory cell capacitors to the communication line;

a sense amplifier circuit; and an n-type isolation transistor and a p-type isolation transistor electrically located between the sense amplifier circuit and the communication line, the integrated memory circuit is adapted to store a maximum charge on the one of the plurality of memory cells which is less than an upper supply voltage level, and adapted to store a minimum charge on the one of the plurality of memory cells which is greater than a lower supply voltage level.

2. The integrated memory circuit of claim 1 wherein the plurality of access devices comprise an n-type access transistor having a source connected to one plate of the plurality of memory cell capacitors, and a drain connected to the communication line.

3. The integrated memory circuit of claim 2 wherein the n-type access transistor is fabricated in a p-well.

4. The integrated memory circuit of claim 3 wherein the p-well is electrically biased to a non-zero voltage level.

5. The integrated memory circuit of claim 1 wherein the n-type isolation transistor has a gate selectively coupled to either an upper supply rail (Vcc) or a lower supply rail (Vss).

6. The integrated memory circuit of claim 1 wherein the p-type isolation transistor has a gate selectively coupled to either an upper supply rail (Vcc) or a lower supply rail (Vss).

7. An integrated memory circuit comprising:

memory cell capacitors having one plate connected to a source of n-type access transistors, the n-type access transistors having a drain connected to a digit line;

a sense amplifier circuit; and an n-type isolation transistor and a p-type isolation transistor electrically located between the sense amplifier circuit and the digit line, the integrated memory circuit is adapted to store a maximum charge on a memory cell which is a p-type transistor threshold voltage less than an upper supply voltage level ($Vcc-V_{TN}$), and adapted to store a minimum charge on the memory cell which is a p-type transistor threshold voltage level greater than a lower supply voltage level ($Vss+V_{TP}$).

8. The integrated memory circuit of claim 7 wherein the n-type isolation transistor has a drain connected to the sense amplifier circuit and a source connected to a source of the p-type isolation transistor, the p-type isolation transistor having a drain connected to the digit line.

9. The integrated memory circuit of claim 8 wherein the n-type access transistor is fabricated in a p-well electrically biased to a non-zero voltage level.

10. The integrated memory circuit of claim 7 wherein:

the n-type isolation transistor has a gate selectively coupled to either an upper supply rail (Vcc) or a lower supply rail (Vss), and the p-type isolation transistor has a gate selectively coupled to either an upper supply rail (Vcc) or a lower supply rail (Vss).

11. The integrated memory circuit of claim 10 wherein Vcc is approximately one volt and Vss is ground.

12. A method of storing data in an integrated memory device, the method comprising the steps of:

storing a reduced voltage on a first memory capacitor, where the reduced voltage is an n-channel transistor threshold voltage level below a supply voltage; and storing an increased voltage on a second memory capacitor, where the increased voltage is a p-channel transistor threshold voltage level above a lower reference voltage.

13. The method of claim 12 further including the step of:

adjusting a substrate bias voltage to minimize leakage currents.

14. The method of claim 13 wherein the step of adjusting the substrate bias voltage comprises the steps of:

lowering the substrate bias voltage to lower a sub-threshold leakage current; and raising the substrate bias voltage to lower a junction leakage current.

15. The method of claim 12 wherein the supply voltage is approximately one volt, and the lower reference voltage is ground.

16. A method of storing data in a memory device, the method comprising the steps of:

providing a supply voltage to a source and gate of an n-channel transistor, the supply voltage being approximately one volt;

coupling a drain of the n-channel transistor to a first memory cell, such that the first memory cell is charged to a voltage level which is an n-channel transistor threshold voltage level below the supply voltage;

connecting a drain and gate of a p-channel transistor to ground; and coupling a source of the p-channel transistor to a second memory cell, such that the second memory cell is charged to a voltage level which is a p-channel transistor threshold voltage level above the ground.

17. The method of claim 16 further including the step of:

adjusting a substrate bias voltage to minimize leakage currents.

18. The method of claim 17 wherein the step of adjusting the substrate bias voltage comprises the steps of:

lowering the substrate bias voltage to lower a sub-threshold leakage current; and raising the substrate bias voltage to lower a junction leakage current.

* * * * *

UNITED STATES PATENT AND TRADEMARK OFFICE
CERTIFICATE OF CORRECTION

PATENT NO. : 5,636,170

DATED : June 3, 1997

INVENTOR(S) : Mirmajid Seyyedy

It is certified that error appears in the above-identified patent and that said Letters Patent is hereby corrected as shown below:

At Claim 7, Col. 7, line 36, please delete "p-type" and insert --n-type--.

Signed and Sealed this

Twenty-first Day of April, 1998

Attest:

BRUCE LEHMAN

Attesting Officer     Commissioner of Patents and Trademarks